US012610517B2

(12) United States Patent
Guo

(10) Patent No.: US 12,610,517 B2
(45) Date of Patent: Apr. 21, 2026

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei City (CN)

(72) Inventor: Shuai Guo, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 387 days.

(21) Appl. No.: 18/327,143

(22) Filed: Jun. 1, 2023

(65) Prior Publication Data

US 2023/0328952 A1      Oct. 12, 2023

Related U.S. Application Data

(63) Continuation of application No. PCT/CN2022/076171, filed on Feb. 14, 2022.

(30) Foreign Application Priority Data

Aug. 19, 2021    (CN) .......................... 202110955818.9

(51) Int. Cl.
  *H10B 12/00*         (2023.01)
(52) U.S. Cl.
  CPC ........... *H10B 12/033* (2023.02); *H10B 12/31* (2023.02); *H10B 12/482* (2023.02)
(58) Field of Classification Search
  CPC ..... H10B 12/033; H10B 12/482; H10B 12/31
  See application file for complete search history.

(56) References Cited

U.S. PATENT DOCUMENTS 9,257,437 B2 *    2/2016   Park ..................... H10B 12/315
10,468,350 B2    11/2019   Kim et al.
(Continued)

FOREIGN PATENT DOCUMENTS

CN        107706179 A      2/2018
CN        109979940 A      7/2019
(Continued)

OTHER PUBLICATIONS

International Search Report cited in PCT/CN2022/076171 mailed Apr. 20, 2022, 8 pages.

*Primary Examiner* — Richard A Booth
(74) *Attorney, Agent, or Firm* — Syncoda LLC; Feng Ma

(57)         ABSTRACT

The present disclosure provides a method of manufacturing a semiconductor structure and a semiconductor structure. The manufacturing method includes: providing an initial structure, where the initial structure includes a base and an initial trench, and the initial trench exposes part of active area structures; forming a capacitor contact structure, where the capacitor contact structure covers the exposed part of the active area structures, and the capacitor contact structure includes a first groove; forming a metal-semiconductor contact structure, where the metal-semiconductor contact structure at least covers a top surface of the capacitor contact structure and fills the first groove; forming a barrier structure, where the barrier structure covers the metal-semiconductor contact structure and an exposed sidewall of the initial trench; and forming a conductive structure, where the conductive structure is connected to the capacitor contact structure through the metal-semiconductor contact structure.

18 Claims, 17 Drawing Sheets

(56)     References Cited

U.S. PATENT DOCUMENTS 10,978,458  B2      4/2021  Ji et al.
11,043,414  B2      6/2021  Kusumoto et al.
12,089,400  B2 *    9/2024  Hong ................... H10B 12/038
12,336,163  B2 *    6/2025  Yan ...................... H10B 12/482
2020/0312707  A1    10/2020  Chne
2023/0055202  A1 *   2/2023  Wang ................. H01L 23/5283
2023/0232615  A1 *   7/2023  Li ...................... H10B 12/0335
                                                        257/773
2024/0014276  A1 *   1/2024  Zeng ................... H10B 12/482

FOREIGN PATENT DOCUMENTS

CN          110364529  A      10/2019
CN          109004054  B       4/2020
CN          112670239  A       4/2021
CN          112864097  A       5/2021

* cited by examiner

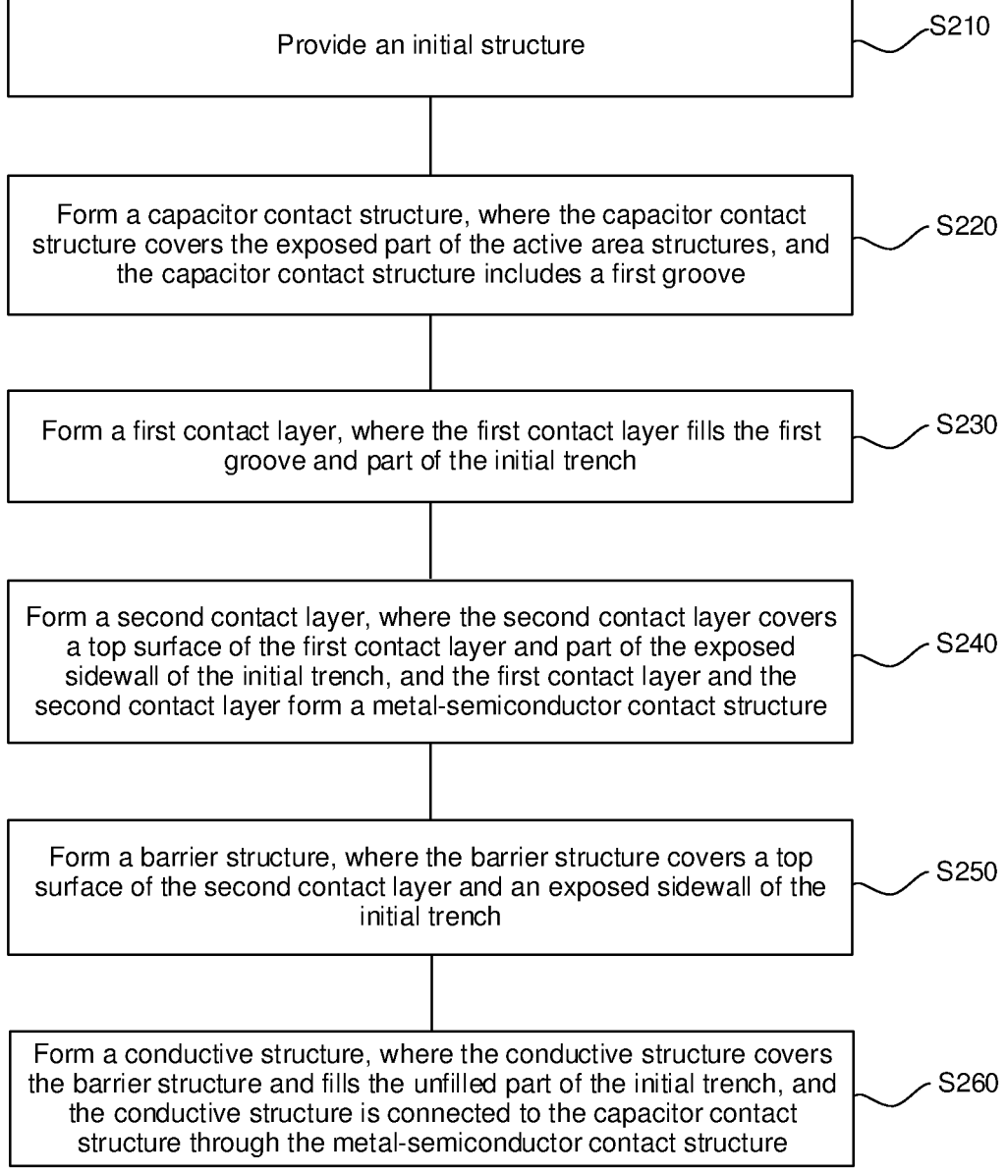

| Provide an initial structure | S210 |

| Form a capacitor contact structure, where the capacitor contact structure covers the exposed part of the active area structures, and the capacitor contact structure includes a first groove | S220 |

| Form a first contact layer, where the first contact layer fills the first groove and part of the initial trench | S230 |

| Form a second contact layer, where the second contact layer covers a top surface of the first contact layer and part of the exposed sidewall of the initial trench, and the first contact layer and the second contact layer form a metal-semiconductor contact structure | S240 |

| Form a barrier structure, where the barrier structure covers a top surface of the second contact layer and an exposed sidewall of the initial trench | S250 |

| Form a conductive structure, where the conductive structure covers the barrier structure and fills the unfilled part of the initial trench, and the conductive structure is connected to the capacitor contact structure through the metal-semiconductor contact structure | S260 |

FIG. 2

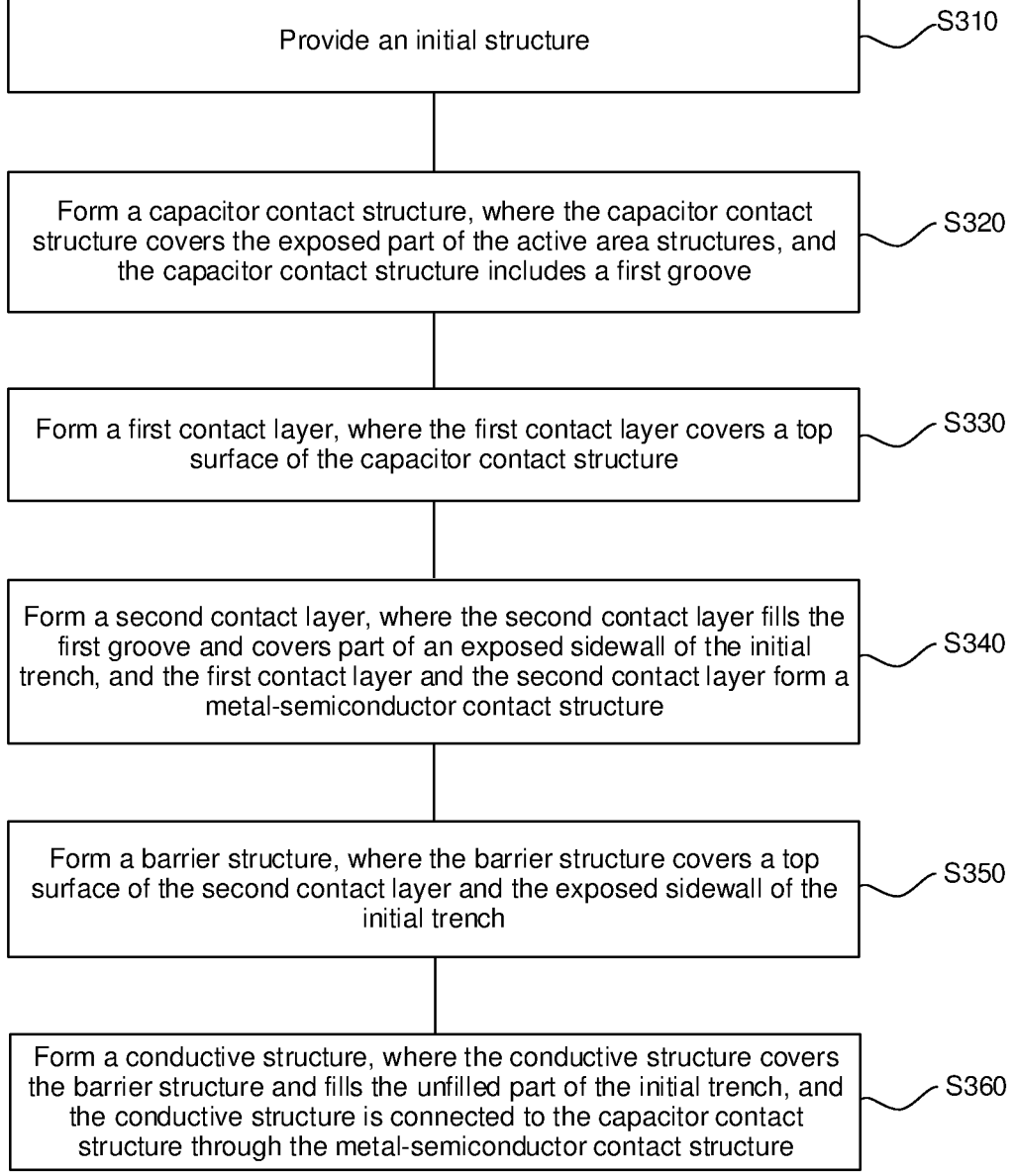

| Provide an initial structure | S310 |

| Form a capacitor contact structure, where the capacitor contact structure covers the exposed part of the active area structures, and the capacitor contact structure includes a first groove | S320 |

| Form a first contact layer, where the first contact layer covers a top surface of the capacitor contact structure | S330 |

| Form a second contact layer, where the second contact layer fills the first groove and covers part of an exposed sidewall of the initial trench, and the first contact layer and the second contact layer form a metal-semiconductor contact structure | S340 |

| Form a barrier structure, where the barrier structure covers a top surface of the second contact layer and the exposed sidewall of the initial trench | S350 |

| Form a conductive structure, where the conductive structure covers the barrier structure and fills the unfilled part of the initial trench, and the conductive structure is connected to the capacitor contact structure through the metal-semiconductor contact structure | S360 |

FIG. 3

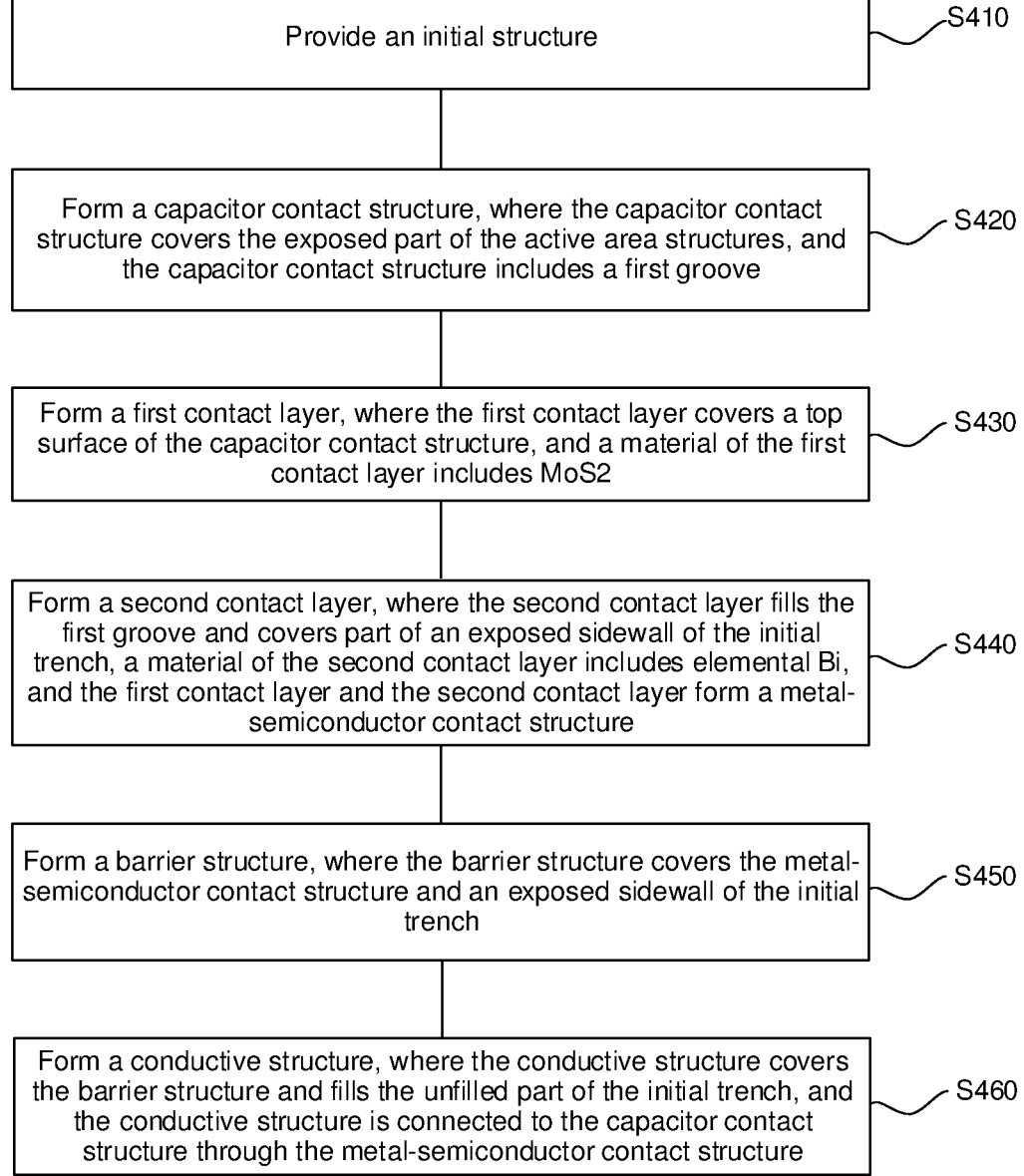

| Provide an initial structure | S410 |

| Form a capacitor contact structure, where the capacitor contact structure covers the exposed part of the active area structures, and the capacitor contact structure includes a first groove | S420 |

| Form a first contact layer, where the first contact layer covers a top surface of the capacitor contact structure, and a material of the first contact layer includes MoS2 | S430 |

| Form a second contact layer, where the second contact layer fills the first groove and covers part of an exposed sidewall of the initial trench, a material of the second contact layer includes elemental Bi, and the first contact layer and the second contact layer form a metal-semiconductor contact structure | S440 |

| Form a barrier structure, where the barrier structure covers the metal-semiconductor contact structure and an exposed sidewall of the initial trench | S450 |

| Form a conductive structure, where the conductive structure covers the barrier structure and fills the unfilled part of the initial trench, and the conductive structure is connected to the capacitor contact structure through the metal-semiconductor contact structure | S460 |

FIG. 4

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2022/076171, filed on Feb. 14, 2022, which claims the priority to Chinese Patent Application No. 202110955818.9, titled "METHOD OF MANUFACTURING SEMICONDUCTOR STRUCTURE AND SEMICONDUCTOR STRUCTURE" and filed on Aug. 19, 2021. The entire contents of International Application No. PCT/CN2022/076171 and Chinese Patent Application No. 202110955818.9 are incorporated herein by reference.

TECHNICAL FIELD

The present disclosure relates to, but is not limited to, a method of manufacturing a semiconductor structure and a semiconductor structure.

BACKGROUND

In the field of integrated circuits, according to the Moore's Law, the performance of integrated circuits increases exponentially with the doubling of semiconductor devices packaged in the integrated circuits. For this reason, as the integration of integrated circuits continuously increases, the line width of the semiconductor devices continuously decreases.

However, the semiconductor devices usually provide an electrical connection through metal-semiconductor contact structures formed. The work function of the metal affects the affinity potential of the semiconductor material and the energy band of the semiconductor material at the interface bends. The contact interface between the metal and semiconductor material is likely to be in metal-induced gap states (MIGS). Such states cause the contact interface between the metal and the semiconductor material to form a schottky barrier. This schottky barrier inhibits the flow of the charge carrier, thus increasing the contact resistance of the metal-semiconductor contact structure, which is not conducive to improving the device performance.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure, including:

providing an initial structure, wherein the initial structure includes a base and a plurality of bit line structures disposed on the base, an initial trench is formed between adjacent two of the bit line structures, the base includes a plurality of active area structures, and the initial trench exposes a part of the active area structures;

forming a capacitor contact structure, wherein the capacitor contact structure covers the exposed part of the active area structures, and the capacitor contact structure includes a first groove;

forming a metal-semiconductor contact structure, wherein the metal-semiconductor contact structure at least covers a top surface of the capacitor contact structure and fills the first groove;

forming a barrier structure, wherein the barrier structure covers the metal-semiconductor contact structure and an exposed sidewall of the initial trench; and forming a conductive structure, wherein the conductive structure covers the barrier structure and fills an unfilled part of the initial trench, and the conductive structure is connected to the capacitor contact structure through the metal-semiconductor contact structure.

A second aspect of the present disclosure provides a semiconductor structure, including:

a base and a plurality of bit line structures disposed on the base;

a capacitor contact structure, formed between adjacent two of the bit line structures, wherein the capacitor contact structure includes a first groove;

a metal-semiconductor contact structure, wherein the metal-semiconductor contact structure at least covers a top surface of the capacitor contact structure and fills the first groove;

a barrier structure, wherein the barrier structure covers the metal-semiconductor contact structure and a part of a sidewall of each of the adjacent two of the bit line structures; and a conductive structure, wherein the conductive structure covers the barrier structure, and the conductive structure is connected to the capacitor contact structure through the metal-semiconductor contact structure.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the structure embodiments of the present disclosure. Those skilled in the art may obtain other accompanying drawings based on these accompanying drawings without creative efforts.

FIG. 2 is a flowchart of a method of manufacturing a semiconductor structure according to an exemplary embodiment;

FIG. 3 is a flowchart of a method of manufacturing a semiconductor structure according to an exemplary embodiment;

FIG. 4 is a flowchart of a method of manufacturing a semiconductor structure according to an exemplary embodiment;

REFERENCE NUMERALS

100, initial structure; 101, substrate; 102, photoresist mask; 103, shallow trench; 104, first mask layer; 105, bit line contact hole; 110, base; 111, active area structure; 112, shallow trench isolation structure; 120, bit line structure; 121, bit line contact part; 130, initial trench; 140, capacitor contact hole; 150, spacing structure;

210, capacitor contact structure; 211, initial capacitor contact structure; 215, first groove; 220, metal-semiconductor contact structure; 221, first contact layer; 222, second contact layer; 230, barrier structure; and 240, conductive structure.

DETAILED DESCRIPTION

In order to make the objectives, technical solutions, and advantages of the embodiments of the present disclosure clearer, the technical solutions in the embodiments of the present disclosure will be clearly and completely described below with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
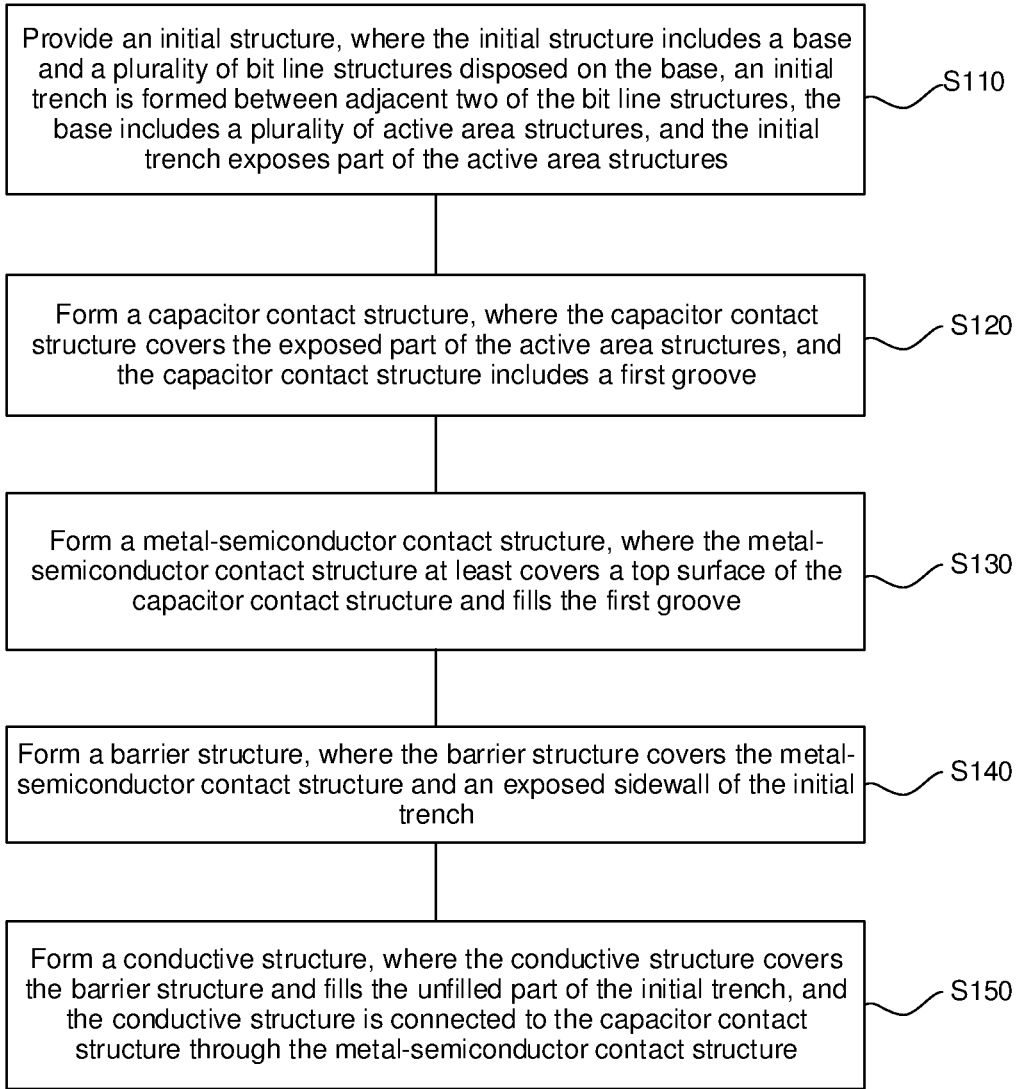
FIG. 1 is a flowchart of a method of manufacturing a semiconductor structure according to an exemplary embodiment.

An exemplary embodiment of the present disclosure provides a method of manufacturing a semiconductor structure. As shown in FIG. 1, FIG. 1 is a flowchart of a method of manufacturing a semiconductor structure according to an exemplary embodiment of the present disclosure. FIGS. 2 to 10 are schematic diagrams of various stages of the method of manufacturing a semiconductor structure. The method of manufacturing a semiconductor structure is described below with reference to FIGS. 2 to 10.

The semiconductor structure is not limited in this embodiment. Description is made by using an example in which the semiconductor structure is a dynamic random access memory (DRAM), but this embodiment is not limited to this, and the semiconductor structure in this embodiment may also be other structure.

As shown in FIG. 1, an exemplary embodiment of the present disclosure provides a method of manufacturing a semiconductor structure, including:

Step S110: Provide an initial structure, where the initial structure includes a base and a plurality of bit line structures disposed on the base, an initial trench is formed between adjacent two of the bit line structures, the base includes a plurality of active area structures, and the initial trench exposes part of the active area structures.

Figure 5:
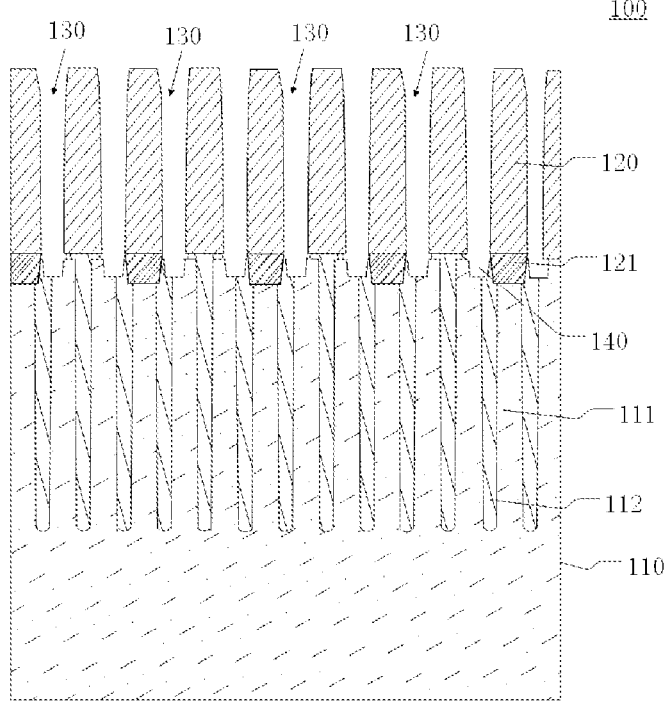
FIG. 5 is a schematic diagram of an initial structure provided in a method of manufacturing a semiconductor structure according to an exemplary embodiment.

As shown in FIG. 5, the base 110 includes active area structures 111. The active area structures 111 are disposed independently. The active area structure 111 is made of a semiconductor material, and the semiconductor material may be one or more selected from the group consisting of silicon, germanium, a silicon-germanium compound, or a silicon-carbon compound. The bit line structures 120 are spaced apart on the base 110. The initial trench 130 is formed between adjacent two of the bit line structures 120. The initial trench 130 exposes part of the top surfaces of the active area structures 111.

Step S120: Form a capacitor contact structure, where the capacitor contact structure covers the exposed part of the active area structures, and the capacitor contact structure includes a first groove.

Figure 8:
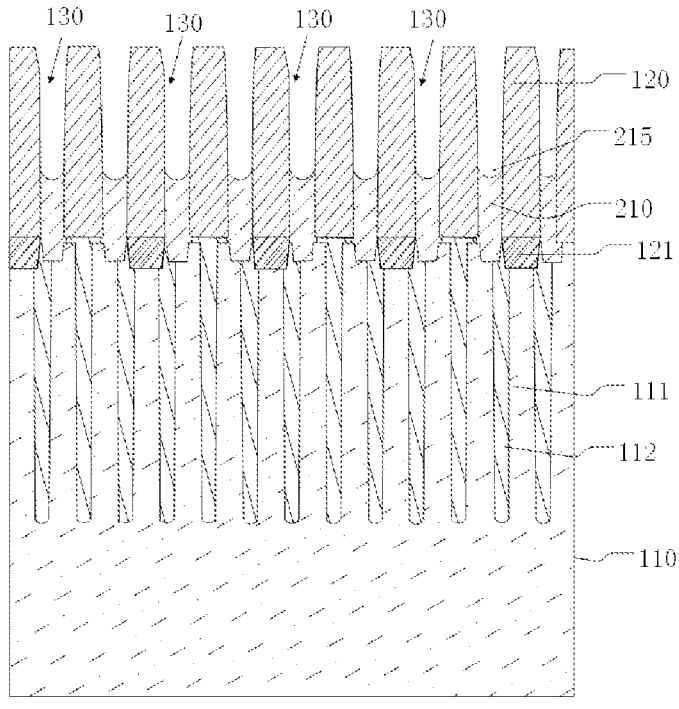
FIG. 8 is a schematic diagram of forming a first groove on a capacitor contact structure in a method of manufacturing a semiconductor structure according to an exemplary embodiment.

As shown in FIG. 8, the capacitor contact structure 210 is made of a doped semiconductor material, that is, n-type or p-type conductive doped polycrystalline silicon.

Figure 6:
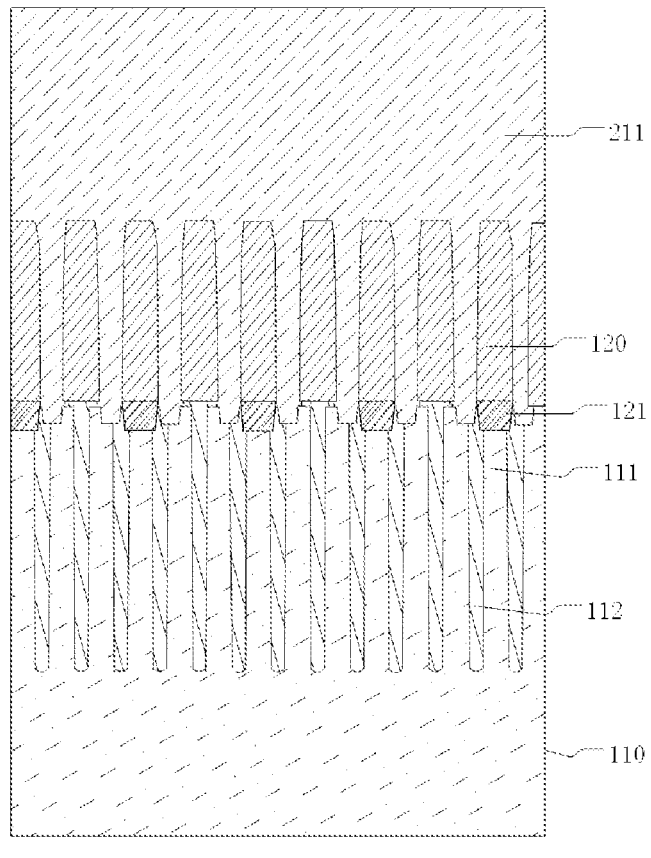
FIG. 6 is a schematic diagram of forming an initial capacitor contact structure in a method of manufacturing a semiconductor structure according to an exemplary embodiment.
Figure 7:
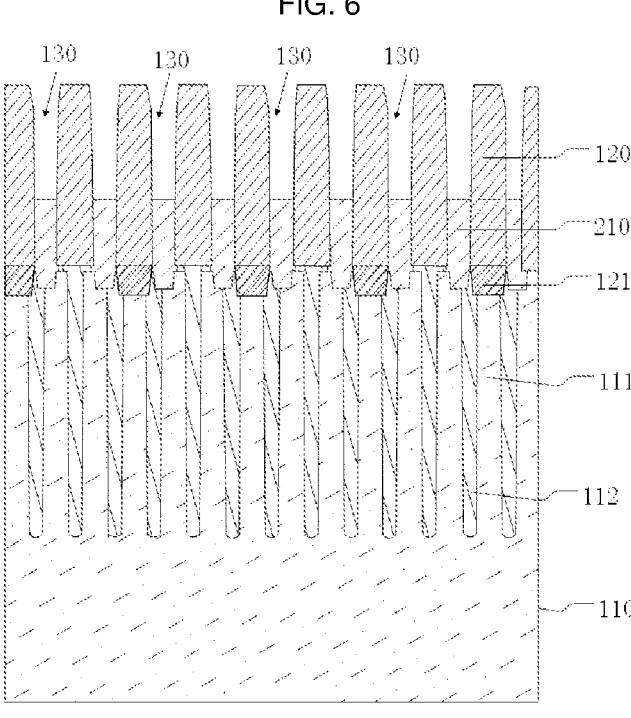
FIG. 7 is a schematic diagram of forming a capacitor contact structure in a method of manufacturing a semiconductor structure according to an exemplary embodiment.

In this embodiment, the forming a capacitor contact structure 210 includes: as shown in FIG. 6, referring to FIG. 5, forming an initial capacitor contact structure 211, where the initial capacitor contact structure 211 fills the initial trench 130. In this embodiment, the atomic layer deposition (ALD) process can be used to deposit the doped polycrystalline silicon, so as to form the initial capacitor contact structure 211. Then, as shown in FIG. 7, referring to FIG. 6, the initial capacitor contact structure 211 is etched, and the retained part of the initial capacitor contact structure 211 forms the capacitor contact structure 210. In this embodiment, the initial capacitor contact structure 211 can be etched back through dry or wet etching to be lower than the top surface of the base 110. At last, as shown in FIG. 8, referring to FIG. 7, the capacitor contact structure 210 is etched to form a first groove 215 on the top surface of the capacitor contact structure 210.

Step S130: Form a metal-semiconductor contact structure, where the metal-semiconductor contact structure at least covers a top surface of the capacitor contact structure and fills the first groove.

Figure 12:
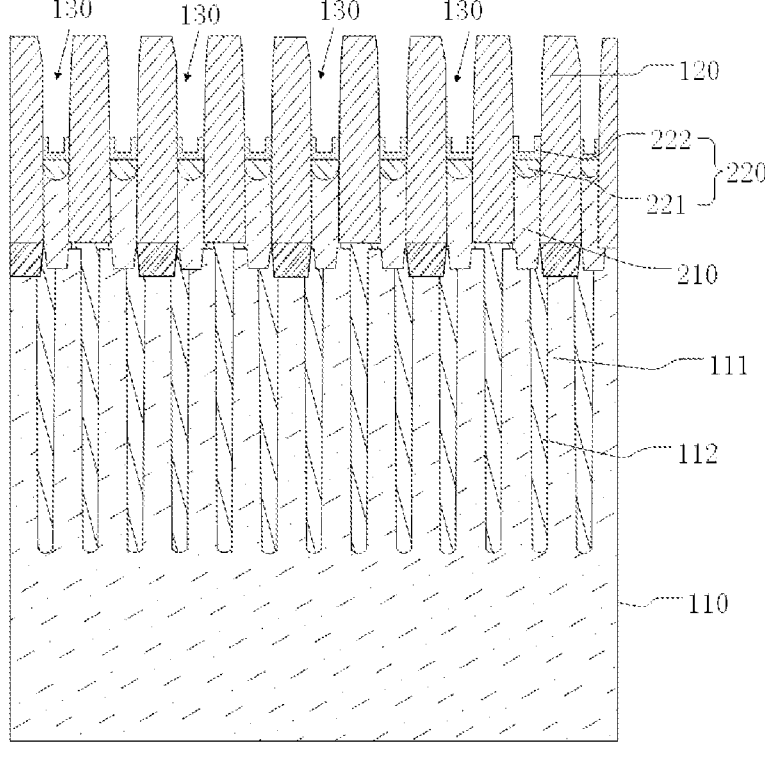
FIG. 12 is a schematic diagram of forming a second contact layer in a method of manufacturing a semiconductor structure according to an exemplary embodiment.

As shown in FIG. 12, the metal-semiconductor contact structure 220 is formed, and the metal-semiconductor contact structure 220 serves as an intermediate transition structure between the capacitor contact structure 210 and the subsequently formed conductive structure 240.

The metal-semiconductor contact structure 220 formed in this embodiment is formed by a two-dimensional semimetal (two-dimensional semimetal) and a material with the half metal property. The energy band structure of a material with the half metal property includes two different energy sub-band structures, one of which has a metallic spin orientation and the other has a semiconductor property. The schottky barrier formed by the two-dimensional semimetal and the material with the half metal property in the metal-semiconductor contact structure 220 is smaller than the schottky barrier formed by direct contact between the capacitor contact structure 210 and the subsequently formed conductive structure.

Step S140: Form a barrier structure, where the barrier structure covers the metal-semiconductor contact structure and an exposed sidewall of the initial trench.

Figure 14:
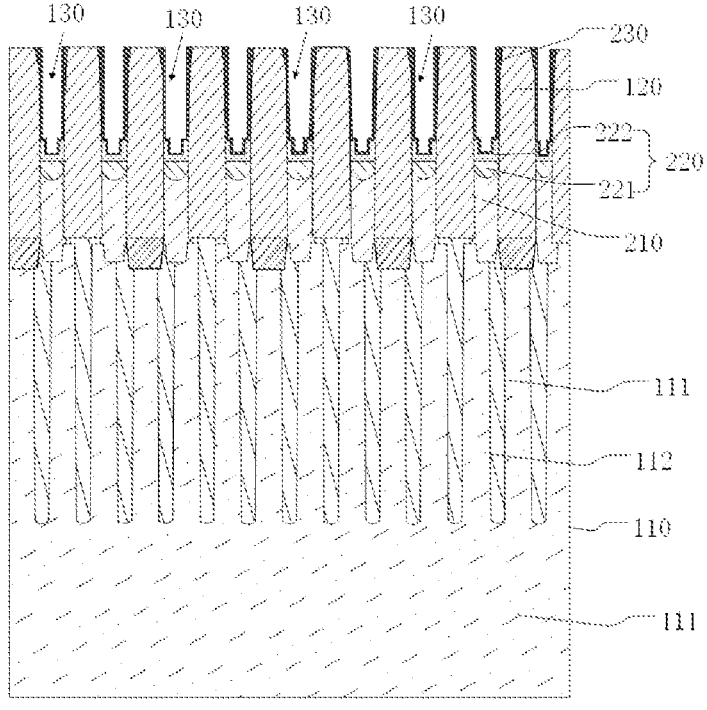
FIG. 14 is a schematic diagram of forming a barrier structure in a manufacturing method of a semiconductor structure according to an exemplary embodiment.

As shown in FIG. 14, referring to FIG. 12, the ALD process can be used for deposition to form a barrier structure 230. The barrier structure 230 covers the exposed part of the metal-semiconductor contact structure 220 and the exposed sidewall of the initial trench 130.

The material of the barrier structure 230 includes inorganic metal nitride. For example, the material of the barrier structure 230 includes one or more selected from the group consisting of titanium nitride, aluminum nitride, boron nitride, hafnium nitride, tantalum nitride, titanium nitride, or zirconium nitride. In this embodiment, the material of the barrier structure 230 is titanium nitride.

Step S150: Form a conductive structure, where the conductive structure covers the barrier structure and fills the unfilled part of the initial trench, and the conductive structure is connected to the capacitor contact structure through the metal-semiconductor contact structure.

Figure 15:
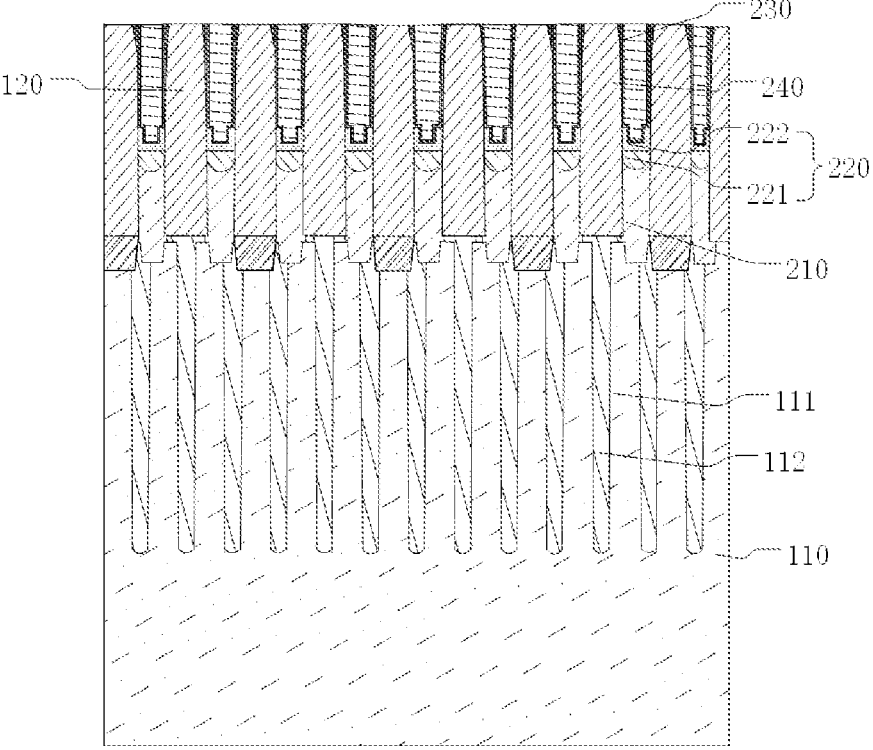
FIG. 15 is a schematic diagram of forming a conductive structure in a method of manufacturing a semiconductor structure according to an exemplary embodiment.

As shown in FIG. 15, referring to FIG. 14, the chemical vapor deposition (CVD) can be used to deposit a metal conductive material to form the conductive structure 240, and the conductive structure 240 fills the other unfilled region of the initial trench 130. In this embodiment, the material of the conductive structure 240 includes metal tungsten.

In this embodiment, the forming the conductive structure 240 includes: depositing metal tungsten to fill the initial trench 130 until the top surface of the bit line structure 120 is covered, and etching off, through dry or wet etching process, the metal tungsten covering the top surface of the bit line structure 120, to form the conductive structure 240.

In the method of manufacturing a semiconductor structure in this embodiment, with the metal-semiconductor contact structure formed between the capacitor contact structure and the conductive structure, the schottky barrier of the metal-semiconductor contact structure is smaller than the schottky barrier formed by the direct contact between the capacitor contact structure and the conductive structure. As the transition structure between capacitor contact structure and the conductive structure, the metal-semiconductor contact structure reduces the schottky barrier generated by the connection between the capacitor contact structure and the conductive structure, reducing the contact resistance resulting from the electrical connection between the capacitor contact structure and the conductive structure, thus further reducing the size of the semiconductor device.

An exemplary embodiment of the present disclosure provides a method of manufacturing a semiconductor structure, as shown in FIG. 2. FIG. 2 is a flowchart of a method of manufacturing a semiconductor structure according to an exemplary embodiment of the present disclosure.

As shown in FIG. 2, an exemplary embodiment of the present disclosure provides a method of manufacturing a semiconductor structure, including:

Step S210: Provide an initial structure.

As shown in FIG. 5, the initial structure 100 includes a base 110 and a plurality of bit line structures 120 disposed on the base 110. An initial trench 130 is formed between adjacent two of bit line structures 120. The base 110 includes a plurality of active area structures 111, and the initial trench 130 exposes part of the active area structures 111.

Step S220: Form a capacitor contact structure, where the capacitor contact structure covers the exposed part of the active area structures, and the capacitor contact structure includes a first groove.

Step S230: Form a first contact layer, where the first contact layer fills the first groove and part of the initial trench.

Figure 9:
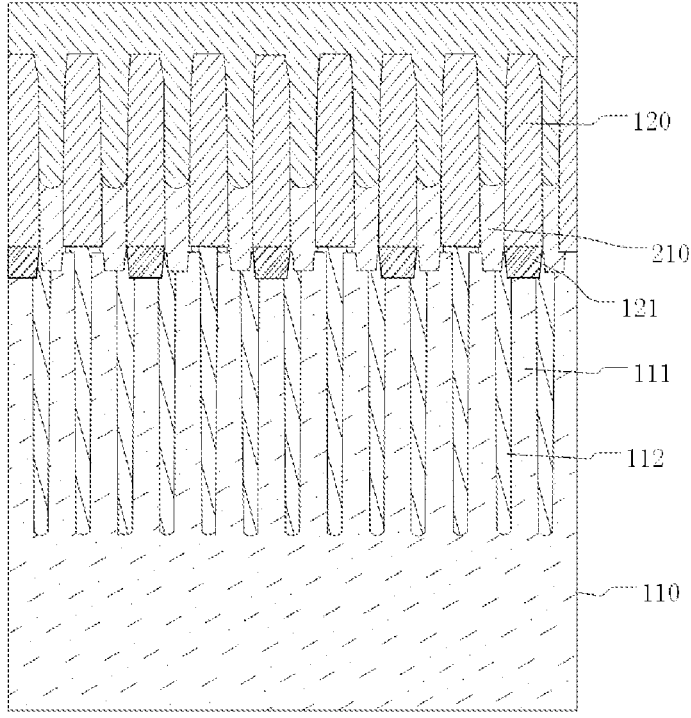
FIG. 9 is a schematic diagram of depositing a first contact material in a method of manufacturing a semiconductor structure according to an exemplary embodiment.
Figure 10:
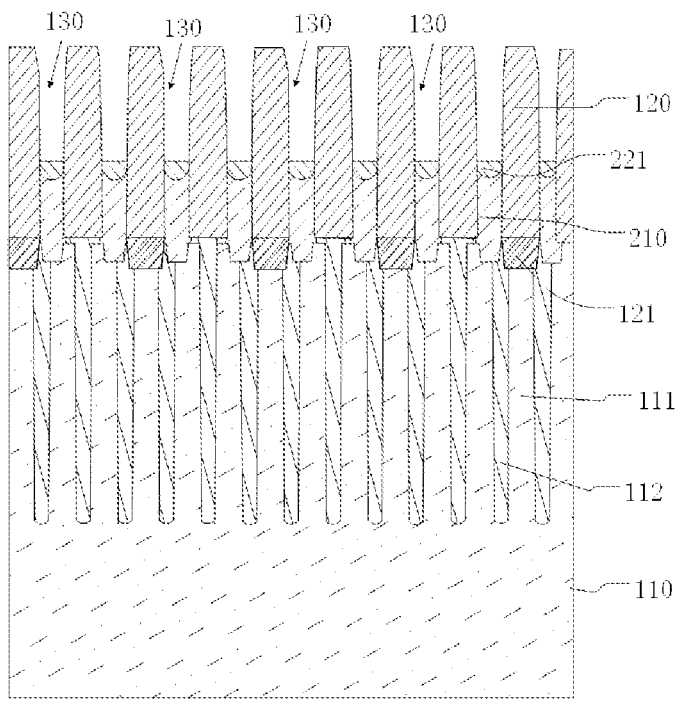
FIG. 10 is a schematic diagram of forming a first contact layer in a method of manufacturing a semiconductor structure according to an exemplary embodiment.

As shown in FIGS. 9 and 10, the first contact material may be deposited to form the first contact layer 221, and the first contact material 221 includes a single layer of semiconductor material.

The first contact layer 221 can be formed through a top-down lift-off process or a bottom-top low-pressure metal-organic chemical vapor deposition (MOCVD) process. In this embodiment, as shown in FIG. 9, referring to FIG. 8, the low-pressure MOCVD can be used to produce a single layer of semiconductor material on the top surface of the capacitor contact structure. The single layer of semiconductor material fills the first groove 215 and the unfilled region in the initial trench 130 and covers the top surfaces of the bit line structures 120. As shown in FIG. 10, referring to FIG. 9, a part of the single layer of semiconductor material covering the top surfaces of the bit line structures 120 is etched off and a part of the single layer of semiconductor material filled the initial trench 130 is etched back. The retained part of the single layer of semiconductor material forms the first contact layer 221. The top surface of the first contact layer 221 is lower than the top surface of the bit line structure 120. The first contact layer 221 fills the first groove 215 and part of the initial trench 130.

In this embodiment, the first contact material includes a single layer of semiconductor material of two-dimensional transition metal dichalcogenides (TMDs). The first contact material can include at least one selected from the group consisting of molybdenum disulfide ($MoS_2$), tungsten disulfide ($WS_2$), rhenium disulfide ($ReS_2$), titanium diselenide ($TiSe_2$), niobium diselenide ($NbSe_2$), or rhenium diselenide ($ReSe_2$).

Step S240: Form a second contact layer, where the second contact layer covers a top surface of the first contact layer and part of the exposed sidewall of the initial trench, and the first contact layer and the second contact layer form a metal-semiconductor contact structure.

Figure 11:
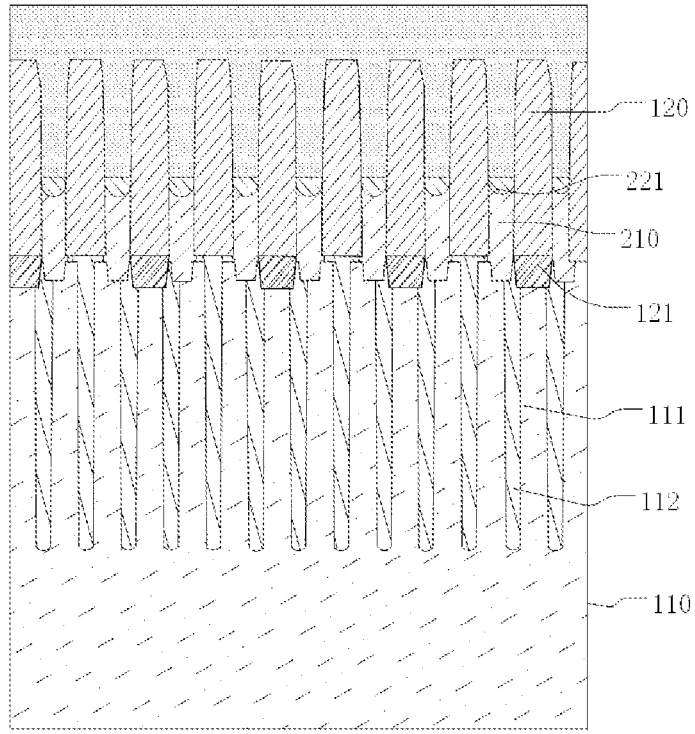
FIG. 11 is a schematic diagram of depositing a second contact material in a method of manufacturing a semiconductor structure according to an exemplary embodiment.

As shown in FIG. 11, referring to FIG. 10, the second contact material can be deposited to form a second contact layer 222, and the second contact material includes a group VA half-metal element. The material including the group VA half-metal element can be evaporated by heating through an electron beam evaporation process or sputtered through a magnetron sputtering process, to be deposited on the top surface of the first contact layer 221 and the exposed sidewall of the initial trench 130.

As shown in FIG. 12, referring to FIG. 11, partial material of the sidewall of the initial trench 130 is etched for removal, to form the second contact layer 222. The second contact layer 222 covers the top surface of the first contact layer 221 and partial sidewall of the initial trench 130. The second contact material can include at least one of the group VA half-metal elements: arsenic (As), antimony (Sb), or bismuth (Bi) in the fourth-sixth period on the periodic table of chemical elements.

Figure 13:
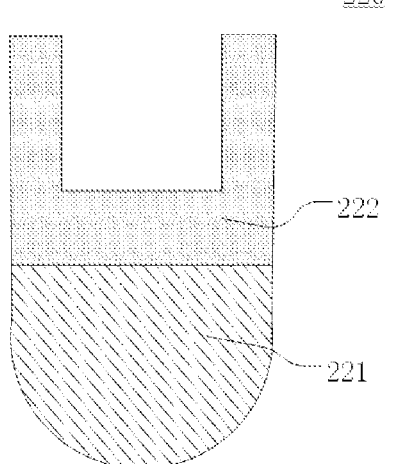
FIG. 13 is a schematic structural diagram of forming a metal-semiconductor contact structure in a method of manufacturing a semiconductor structure according to an exemplary embodiment.

As shown in FIGS. 12 and 13, the first contact layer 221 and the second contact layer 222 form the metal-semiconductor contact structure. The Fermi energy level of the group VA half-metal element of the second contact layer 222 is close to the minimum value of the semiconductor conduction band of the two-dimensional TMD of the first contact layer 221, valence band of the two-dimensional TMD is saturated (the gap state is saturated), and the metal-induced gap state of the two-dimensional TMD induced by the group VA half-metal element is inhibited. The schottky barrier generated at the contact interface between the first contact layer 221 and the second contact layer 222 tends to decrease towards near zero and therefore can be negligible. For carriers, there is no potential barrier from the first contact layer 221 to the second contact layer 222, while there is only a small quantity of or even negligible potential barriers from the second contact layer 222 to the first contact layer 221. The two-dimensional TMD of the first contact layer 221 and the group VA half-metal element of the second contact layer 222 form a good ohmic contact. The contact interface of the first contact layer 221 and the second contact layer 222 has a small resistance, and the density of carrier flowing from the first contact layer 221 to the second contact layer 222 is high.

Step S250: Form a barrier structure, where the barrier structure covers a top surface of the second contact layer and the exposed sidewall of the initial trench.

Step S260: Form a conductive structure, where the conductive structure covers the barrier structure and fills the unfilled part of the initial trench, and the conductive structure is connected to the capacitor contact structure through the metal-semiconductor contact structure.

Steps S210 and S220 in this embodiment and steps S110 and S120 in the foregoing embodiment are implemented in the same manner, and steps S250 and S260 and steps S140 and S150 in the foregoing embodiment are implemented in the same manner, which is not described herein again herein.

In this embodiment, the metal-semiconductor contact structure includes a first contact layer and a second contact layer. The first contact layer includes a single layer of semiconductor material. The second contact layer includes a group VA half-metal element. The single layer of semiconductor material is in contact with the material of the group VA half-metal element, which reduces the schottky barrier generated at the contact interface between the first contact layer and the second contact layer, such that a good ohmic contact is formed at a contact interface between the first contact layer and the second contact layer, thus reducing the resistance between the first contact layer and the second contact layer. As the intermediate transition structure providing an electrical connection between the capacitor contact structure and the conductive structure, the metal-semiconductor contact structure reduces the contact resistance between the capacitor contact structure and the conductive structure, allowing for higher through-state current density between the capacitor contact structure and the conductive structure. This improves the potential of semiconductor structures for high performance and high miniaturization, thus further reducing the size of the semiconductor device. The first contact layer fills the first groove and increases the contact area between the first contact layer and the first groove. The second contact layer covers the top surface of the first contact layer and part of the exposed sidewall of the initial trench, increasing the contact area between the second contact layer and the conductive structure. This further increases the migration rate of the carriers from the capacitor contact structure to the conductive structure, and thus increases the through-state current density between the capacitor contact structure and the conductive structure.

An exemplary embodiment of the present disclosure provides a method of manufacturing a semiconductor structure, as shown in FIG. 3. FIG. 3 is a flowchart of a method of manufacturing a semiconductor structure according to an exemplary embodiment of the present disclosure.

As shown in FIG. 3, an exemplary embodiment of the present disclosure provides a method of manufacturing a semiconductor structure, including:

S310: Provide an initial structure.

For example, in this embodiment, the providing an initial structure includes the following steps:

S311: Provide a substrate.

Figure 20:
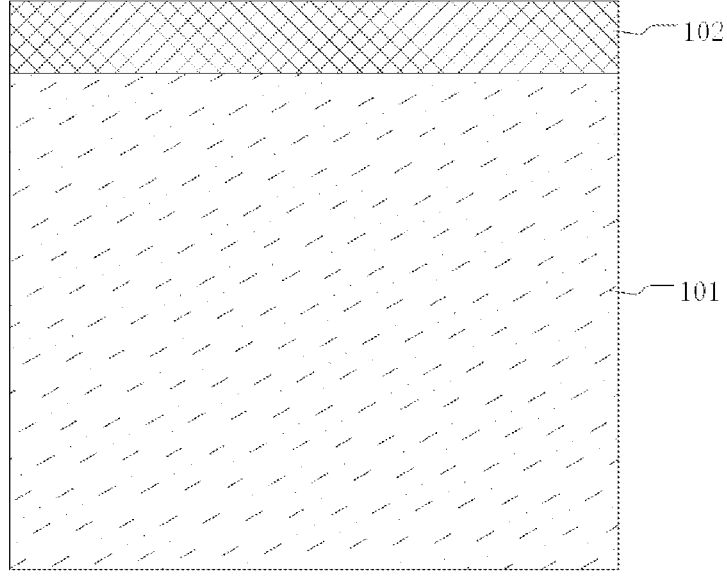
FIG. 20 is a schematic diagram of forming a photoresist mask on a substrate in a method of manufacturing a semiconductor structure according to an exemplary embodiment.

As shown in FIG. 20, the substrate 101 may be made of a semiconductor material. For example, the semiconductor material may be one or more selected from the group consisting of silicon, germanium, a silicon-germanium compound, or a silicon-carbon compound.

S312: Etch the substrate to form a plurality of active area structures arranged in an array.

Figure 21:
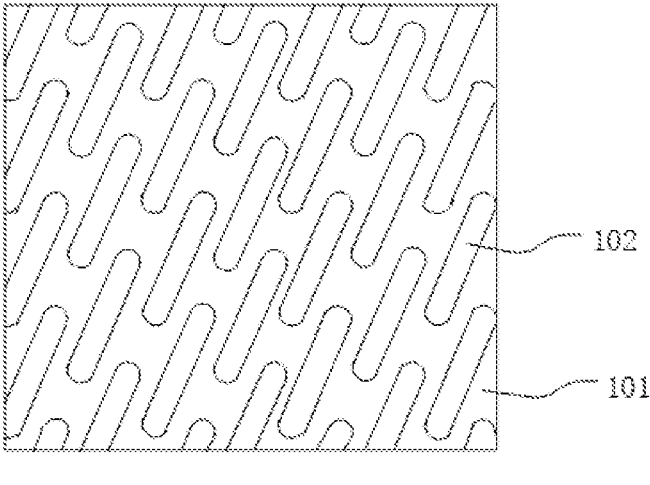
FIG. 21 is a schematic diagram of projection of a photoresist mask on a substrate in a method of manufacturing a semiconductor structure according to an exemplary embodiment.
Figure 22:
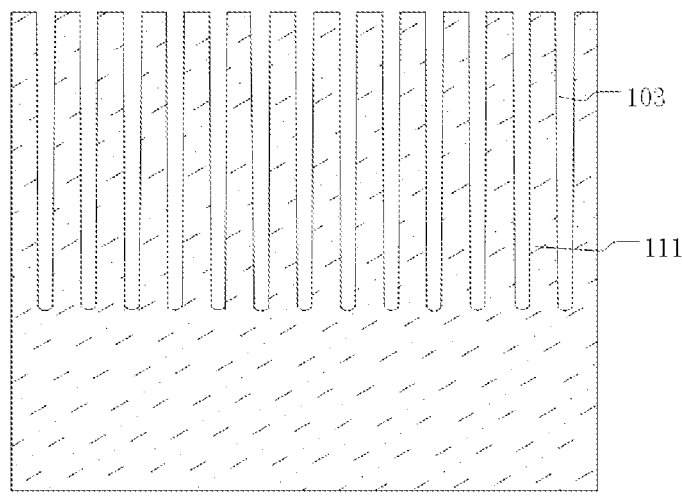
FIG. 22 is a schematic diagram of etching a substrate to form an active area structure in a method of manufacturing a semiconductor structure according to an exemplary embodiment.

As shown in FIG. 20, a photoresist mask layer 102 is formed on the top surface of the substrate 101. As shown in FIG. 21, projection of the photoresist mask layer 102 on the substrate 101 exposes part of the top surface of the substrate 101. As shown in FIG. 22, the photoresist mask layer 102 is removed through dry or wet etching to expose part of the substrate 101 and form the shallow trench 103. The photoresist mask layer 102 is removed, and the substrate covered by the photoresist mask layer 102 forms a plurality of active area structures 111 arranged independently. The active area structures 111 are isolated by the shallow trench 103.

S313: Form a shallow trench isolation structure, where the shallow trench isolation structure is configured to isolate the active area structures.

Figure 23:
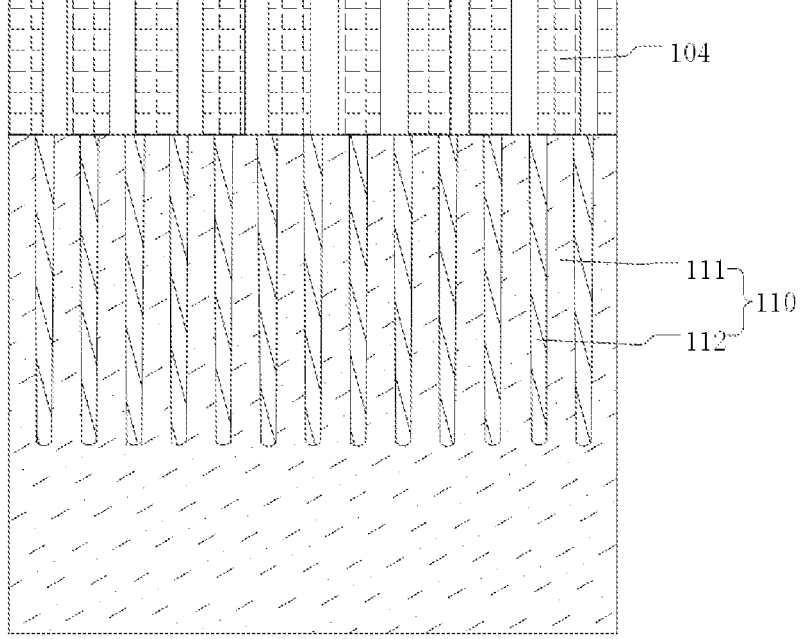
FIG. 23 is a schematic diagram of forming a shallow trench isolation structure in a method of manufacturing a semiconductor structure according to an exemplary embodiment.

As shown in FIG. 23, referring to FIG. 22, the CVD or ALD process may be used to deposit a low-k dielectric material, so as to fill the shallow trench 103 and form the shallow trench isolation structure 112, the shallow trench isolation structure 112 isolating the active area structures 111. The shallow trench isolation structure 112 and the active area structures 111 form the base 110. In this embodiment, silicon oxide is deposited in the shallow trench 103 to form the shallow trench isolation structure 112.

S314: Form bit line contact holes, where the bit line contact hole exposes part of the active area structures and part of the shallow trench isolation structure.

Figure 24:
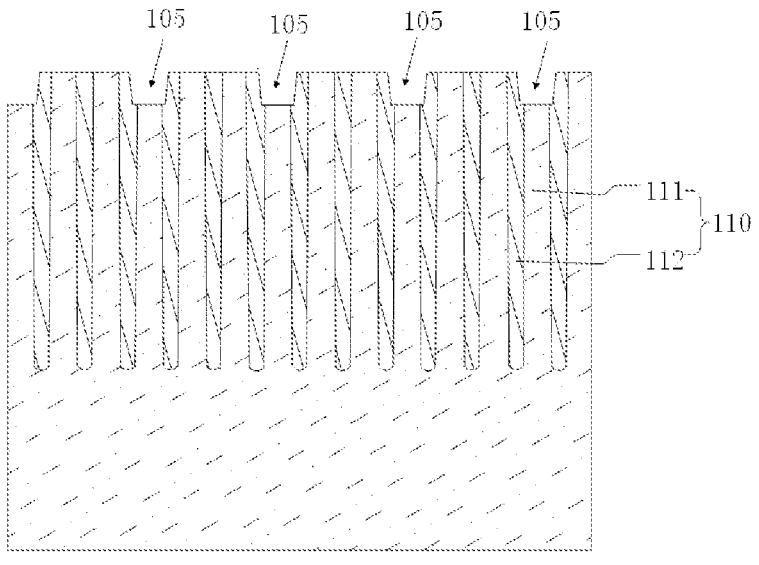
FIG. 24 is a schematic structural diagram of forming a bit line contact hole in the method of manufacturing a semiconductor structure according to an exemplary embodiment.
Figure 25:
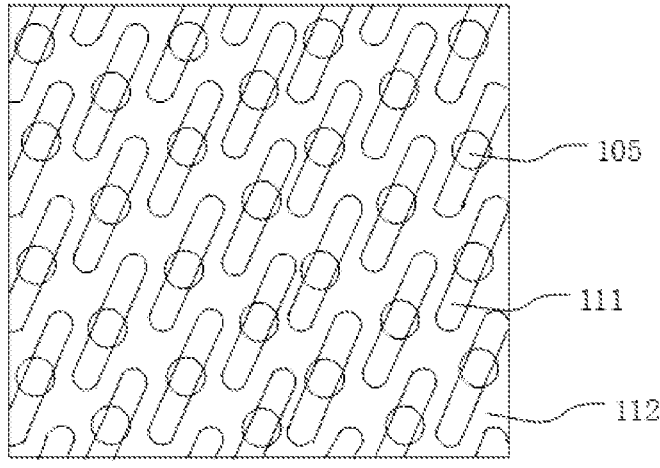
FIG. 25 is a schematic diagram of projection of a formed bit line contact hole on the base in a method of manufacturing a semiconductor structure according to an exemplary embodiment.

As shown in FIG. 23, a first mask layer 104 is formed on the top surfaces of the active area structures 111 and the top surface of the shallow trench isolation structure 112. Projection of the first mask layer 104 on the substrate 101 exposes part of the active area structures 111 and part of the shallow trench isolation structure 112. As shown in FIG. 24, the part of the active area structures 111 and the part of the shallow trench isolation structure 112 exposed by the first mask layer 104 are removed through dry or wet etching process, to form bit line contact holes 105. As shown in FIG. 25, the bit line contact hole 105 exposes part of the active area structures 111 and part of the shallow trench isolation structure 112.

S315: Form bit line contact parts, where the bit line contact part fills the bit line contact hole.

Figure 26:
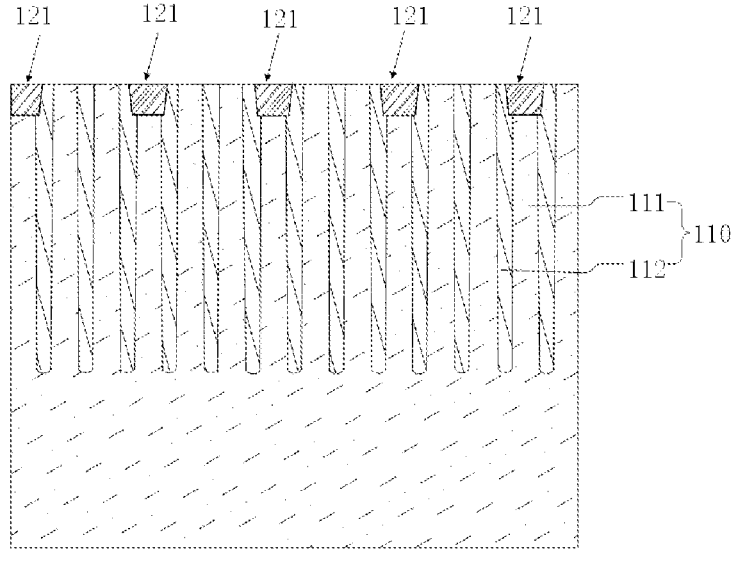
FIG. 26 is a schematic diagram of forming a bit line contact part in a method of manufacturing a semiconductor structure according to an exemplary embodiment.

As shown in FIG. 26, referring to FIG. 24, a doped semiconductor material is deposited through the CVD or ALD process, to form the bit line contact parts 121. In this embodiment, the material of the bit line contact part 121 includes conductive doped polysilicon.

S316: Form bit line structures.

Figure 27:
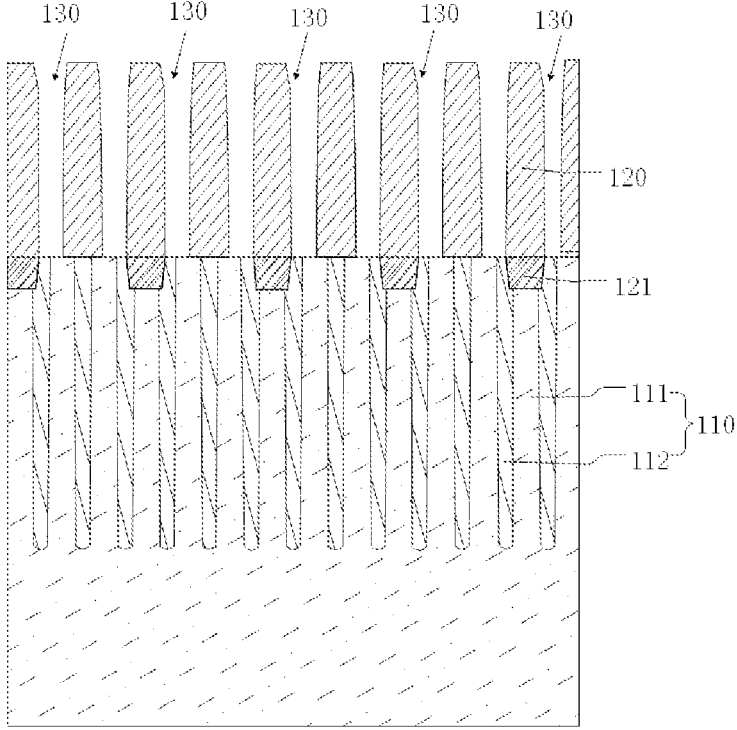
FIG. 27 is a schematic diagram of forming a bit line structure in a method of manufacturing a semiconductor structure according to an exemplary embodiment.

As shown in FIG. 27, referring to FIG. 26, the bit line structure 120 is disposed on the top surfaces of the active area structures 111 and a top surface of the shallow trench isolation structure 112. The bit line structure is connected to the bit line contact part 121. The bit line structures 120 are parallel to each other. The initial trench 130 is formed between adjacent two of the bit line structures 120. The initial trench 130 exposes a part of the top surfaces of the active area structures 111.

In this embodiment, the providing an initial structure includes: S317: Form spacing structures in the initial trench, where an extension direction of the spacing structure is perpendicular to an extension direction of the bit line structure.

Figure 28:
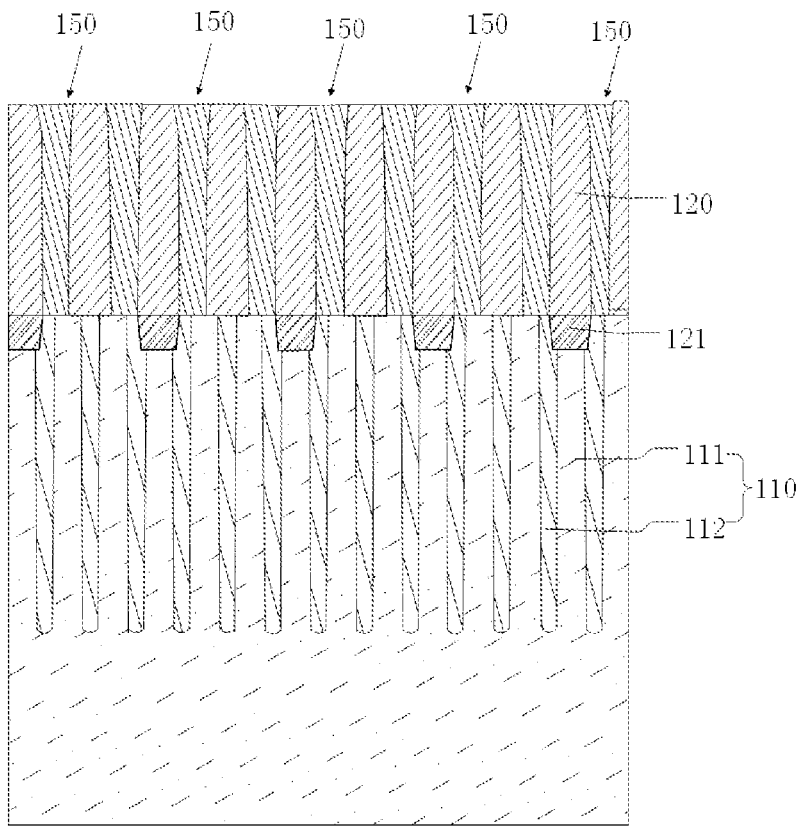
FIG. 28 is a schematic diagram of forming a spacing structure in an initial trench in a method of manufacturing a semiconductor structure according to an exemplary embodiment.
Figure 29:
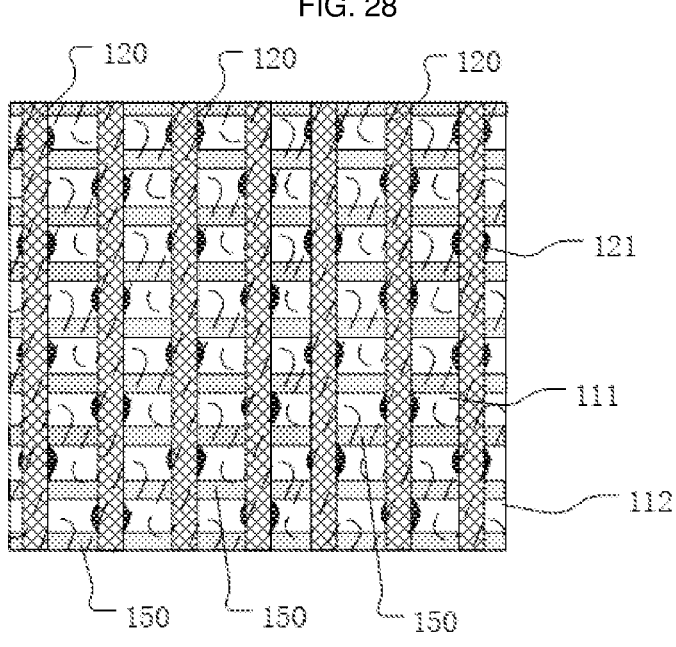
FIG. 29 is a schematic diagram of projection of a formed spacing structure on a base in a method of manufacturing a semiconductor structure according to an exemplary embodiment.

As shown in FIG. 28, referring to FIG. 27, the spacing structures 150 are formed, and the spacing structure 150 is located in the initial trench 130 and covers part of the initial trench 130. As shown in FIGS. 28 and 29, the spacing structure 150 is arranged in a direction perpendicular to the extension direction of the bit line structure 120, and the spacing structure 150 exposes part of the active area structures 111 and part of the top surface of the shallow trench isolation structure 112.

S318: Use the spacing structures and the bit line structures as a mask to remove the part of the active area structures and part of the shallow trench isolation structure that are exposed by the initial trench, so as to form a capacitor contact hole.

As shown in FIG. 5, referring to FIGS. 28 and 29, the part of the active area structures 111 and the part of the shallow trench isolation structure 112 exposed by the spacing structures 150 and the bit line structures 120 are removed through dry or wet etching process, to form a capacitor contact hole 140. The capacitor contact hole 140 exposes part of the active area structures 111 and part of the shallow trench isolation structure 112.

Step S320: Form a capacitor contact structure, where the capacitor contact structure covers the exposed part of the active area structures, and the capacitor contact structure includes a first groove.

For example, in this embodiment, the forming the capacitor contact structure 210 includes: as shown in FIG. 6, referring to FIG. 5, depositing doped polysilicon through the ALD to form an initial capacitor contact structure 211, where the initial capacitor contact structure 211 fills the capacitor contact hole 140 and the initial trench 130. Then, as shown in FIG. 7, referring to FIG. 6, the initial capacitor contact structure 211 is etched through dry or wet etching process, and the initial capacitor contact structure 211 is etched back to be lower than the top surface of the base 110. The retained part of the initial capacitor contact structure 211 forms the capacitor contact structure 210, and the capacitor contact structure 210 fills the capacitor contact hole 140 and part of the initial trench 130. At last, as shown in FIG. 8, referring to FIG. 7, the top surface of the capacitor contact structure 210 is etched, to form the first groove 215, concaved towards the base 110, on the top surface of the capacitor contact structure 210.

Step S330: Form a first contact layer, where the first contact layer covers the top surface of the capacitor contact structure.

Figure 16:
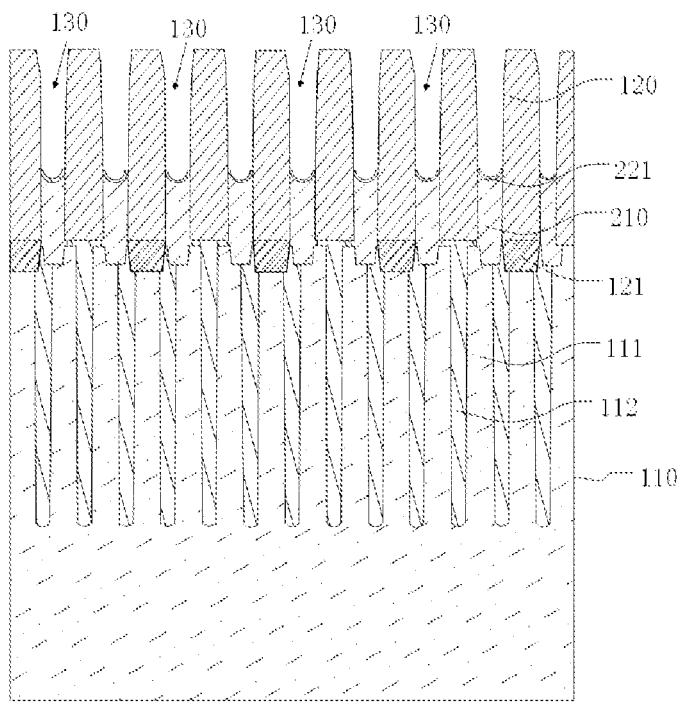
FIG. 16 is a schematic diagram of forming a first contact layer in a method of manufacturing a semiconductor structure according to an exemplary embodiment.

As shown in FIG. 16, referring to FIG. 8, the first contact material can be deposited through the top-down lift-off process or the bottom-top low-pressure MOCVD process, to form the first contact layer 221, the first contact material including a single layer of semiconductor material.

In this embodiment, the first contact material includes a single layer of semiconductor material of two-dimensional TMDs. The first contact material can include at least one selected from the group consisting of $MoS_2$, $WS_2$, $ReS_2$, $TiSe_2$, $NbSe_2$, or $ReSe_2$.

A three-dimensional TMD monolayer includes three atomic layers. The three atomic layers are arranged in a sulfur-transition metal atom-sulfur atom pattern. The three-dimensional TMD monolayer has good semiconductor properties with high planar carrier mobility.

In this embodiment, as shown in FIG. 16, the lift-off process can be used to form a three-dimensional semiconductor material. A single atom layer or multiple atom layers are removed from the three-dimensional semiconductor material through the lift-off process to form a single layer of two-dimensional semimetal. Then, the single layer of two-dimensional semimetal is transferred to the capacitor contact structure 210. The single layer of two-dimensional semimetal covers the top surface of the capacitor contact structure to form the first contact layer 221.

Step S340: Form a second contact layer, where the second contact layer fills the first groove and covers part of the exposed sidewall of the initial trench, and the first contact layer and the second contact layer form a metal-semiconductor contact structure.

Figure 17:
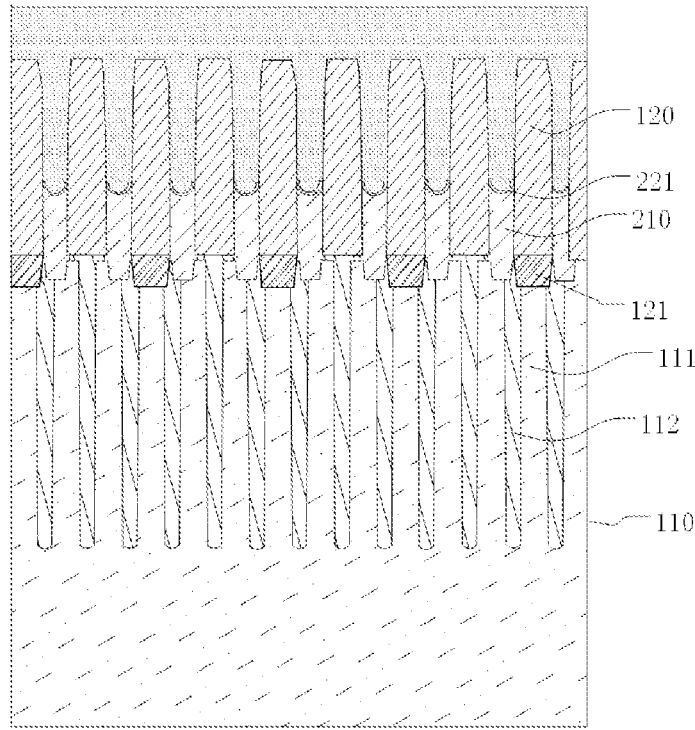
FIG. 17 is a schematic diagram of depositing a second contact material in a method of manufacturing a semiconductor structure according to an exemplary embodiment.
Figure 18:
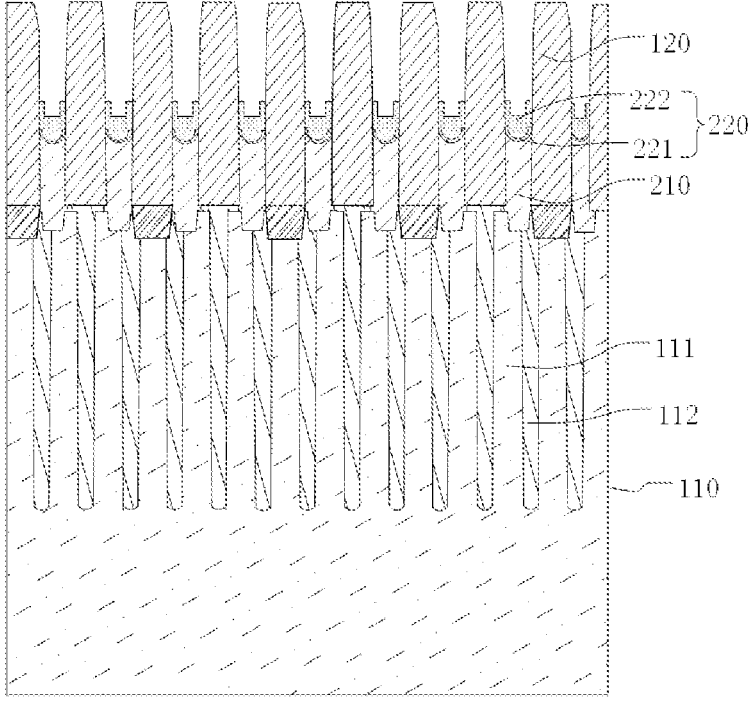
FIG. 18 is a schematic diagram of forming a second contact layer in a method of manufacturing a semiconductor structure according to an exemplary embodiment.

As shown in FIG. 17, referring to FIG. 16, the second contact material can be evaporated by heating through an electron beam evaporation process or sputtered through a magnetron sputtering process for deposition to form a second contact layer 222. The second contact material includes a material of the group VA half-metal element. The material of the group VA half-metal element covers the top surface of the first contact layer 221 and the exposed sidewall of the initial trench 130 and fills the first groove 215. As shown in FIG. 18, referring to FIG. 17, part of the material covering the sidewall of the initial trench 130 is etched off, to form the second contact layer 222. The second contact material can include at least one of the group VA half-metal elements: As, Sb, or Bi in the fourth-sixth period on the periodic table of chemical elements.

Step S350: Form a barrier structure, where the barrier structure covers a top surface of the second contact layer and the exposed sidewall of the initial trench.

Step S360: Form a conductive structure, where the conductive structure covers the barrier structure and fills the unfilled part of the initial trench, and the conductive structure is connected to the capacitor contact structure through the metal-semiconductor contact structure.

Steps S350 and S360 of this embodiment are implemented in the same manner as steps S140 and S150 of the foregoing embodiment and are not described in detail again herein.

The metal-semiconductor contact structure in this embodiment includes the first contact layer and the second contact layer. The first contact layer covers the top surface of the capacitor contact structure, that is, the first contact layer is of a concave structure with the bottom down, increasing the contact area between the first contact layer and the second contact layer, and reducing the contact resistance of the metal-semiconductor contact structure. In this case, the second contact layer covers part of the sidewall of the initial trench, increasing the contact area between the second contact layer and the conductive structure, and reducing the contact resistance of the metal-semiconductor contact structure and the conductive structure, thus further reducing the size of the semiconductor device. The small schottky barrier generated at the contact interface between the first contact layer of the two-dimensional semiconductor material and the second contact layer including the group VA half-metal element is small, and the small contact resistance of the metal-semiconductor contact structure allow a higher migration rate of the carriers flowing from the capacitor contact structure to the conductive structure.

An exemplary embodiment of the present disclosure provides a method of manufacturing a semiconductor structure, as shown in FIG. 4. FIG. 4 is a flowchart of a method of manufacturing a semiconductor structure according to an exemplary embodiment of the present disclosure.

As shown in FIG. 4, an exemplary embodiment of the present disclosure provides a method of manufacturing a semiconductor structure, including:

Step S410: Provide an initial structure.

As shown in FIG. 5, the initial structure 100 includes a base 110 and a plurality of bit line structures 120 disposed on the base 110. An initial trench 130 is formed between adjacent two of bit line structures 120. The base 110 includes a plurality of active area structures 111, and the initial trench 130 exposes part of the active area structures 111.

Step S420: Form a capacitor contact structure, where the capacitor contact structure covers the exposed part of the active area structures, and the capacitor contact structure includes a first groove.

Step S430: Form a first contact layer, where the first contact layer covers the top surface of the capacitor contact structure, and a material of the first contact layer includes $MoS_2$.

As shown in FIG. 16, the first contact layer 221 can be formed through MOCVD. In this embodiment, molybdenum hexacarbonyl ($Mo(CO)_6$) and diethyl sulfide ($C_4H_{10}S$) can be used as precursors of molybdenum (Mo) and sulfur (S), respectively, or molybdenum pentachloride ($MoCl_5$) and hexamethyldisilathiane (HMDST) can also be used as precursors of Mo and S, respectively. The precursors of Mo and S are separately supplied to the semiconductor structure in the form of vapor using argon (Ar) as the carrier gas. The precursors of Mo and S react to form $MoS_2$, and then $MoS_2$ is deposited on the top surface of the capacitor contact structure 210 to form the first contact layer 221.

With a planar carrier mobility of 200 to 500 $cm^2V^{-1}$ $s^{-1}$ and a forbidden band width of 1.3 eV, $MoS_2$ is an indirect forbidden gap semiconductor material. $MoS_2$ deposited on the capacitor contact structure 210 in this embodiment is of a monolayer with a forbidden band width of 1.8 eV, and is a semiconductor material that transforms from an indirect forbidden gap to a direct forbidden gap.

Step S440: Form a second contact layer, where the second contact layer fills the first groove and covers part of the exposed sidewall of the initial trench, a material of the second contact layer includes elemental Bi (bismuth), and the first contact layer and the second contact layer form a metal-semiconductor contact structure.

As shown in FIGS. 17 and 18, the electron beam evaporation process can be used to evaporate Bi or a Bi compound by heating, so as to form the second contact layer 222. In this embodiment, the deposition rate is 0.5 Å/s to 1 Å/s. The second contact layer 222 covers the top surface of the first contact layer 221 and part of the exposed sidewall of the initial trench 130 and fills the first groove 215.

Bi is the metal with the highest anti-magnetic property as well as a large Hall coefficient and resistivity. When the thickness of Bi decreases to the nanometer scale, the energy band structure of Bi changes. Specifically, the energy band structure of Bi is transformed to include one energy subband structure with metallic spin orientation and one energy subband structure with the semiconductor property. Therefore, the nanometer-scale Bi is semi-metallic. The Bi compound also has the above properties, for example, bismuth selenide ($Bi_2Se_3$) and bismuth telluride (bismuth(III) telluride, $Bi_2Te_3$).

Figure 19:
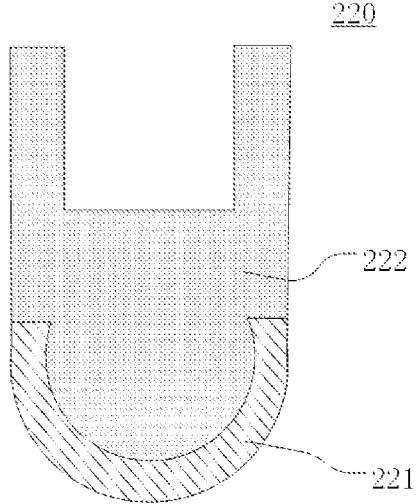
FIG. 19 is a schematic structural diagram of forming a metal-semiconductor contact structure in a method of manufacturing a semiconductor structure according to an exemplary embodiment.

As shown in FIG. 19, the second contact layer 222 and the first contact layer 221 form the metal-semiconductor contact structure 220. At the contact interface between the second contact layer 222 and the first contact layer 221, the Fermi energy level of Bi is higher than the conduction band minimum of $MoS_2$, and the pz orbital of Bi resonates with the pz and dz2 orbitals of $MoS_2$. The distribution of inductive electric dipoles at the contact interface of Bi and $MoS_2$ falls into the van der Waals gap. Electron saturation of the metal-induced gap state of $MoS_2$ leads to gap state saturation of $MoS_2$. This helps to achieve zero schottky barrier at the contact interface between Bi and $MoS_2$ and allows for an ohmic contact formed at the contact interface between Bi and MoS$_2$, thus decreasing the contact resistance between the second contact layer 222 and the first contact layer 221.

Step S450: Form a barrier structure, where the barrier structure covers the metal-semiconductor contact structure and an exposed sidewall of the initial trench.

Step S460: Form a conductive structure, where the conductive structure covers the barrier structure and fills the unfilled part of the initial trench, and the conductive structure is connected to the capacitor contact structure through the metal-semiconductor contact structure.

Steps S410 and S420 in this embodiment and steps S310 and S320 in the foregoing embodiment are implemented in the same manner, and steps S450 and S460 and steps S350 and S360 in the foregoing embodiment are implemented in the same manner, which is not described herein again herein.

In this embodiment, with the metal-semiconductor contact structure formed by the half metal Bi and the semiconductor MoS$_2$ used as the intermediate transition structure for contact between the capacitor contact structure and the conductive structure, the direct contact between the semiconductor material of the capacitor contact structure and the metal material of the conductive structure can be avoided. This helps to achieve zero schottky barrier at the contact interface between Bi and MoS$_2$, such that the carriers migrate from the first contact layer to the second contact layer without passing through the potential barrier. This enables a better ohmic contact to be formed at the contact interface between Bi and MoS$_2$ to form, thus allowing for a minimum contact resistance of the metal-semiconductor contact structure.

An exemplary embodiment of the present disclosure provides a semiconductor structure. As shown in FIG. 15, referring to FIG. 5, the semiconductor structure includes the base 110 and a plurality of bit line structures 120 disposed on the base 110. The semiconductor structure further includes a capacitor contact structure 210. The capacitor contact structure 210 includes a first groove 215. The capacitor contact structure 210 is formed between adjacent two of the bit line structures 120. The semiconductor structure further includes a metal-semiconductor contact structure 220. The metal-semiconductor contact structure 220 at least covers the top surface of the capacitor contact structure 210 and fills a first groove 215. The semiconductor structure further includes a barrier structure 230 and a conductive structure 240. The barrier structure 230 covers the metal-semiconductor contact structure 220 and a part of a sidewall of each of the adjacent two of the bit line structures 120. The conductive structure 240 covers the barrier structure 230. The conductive structure 240 is connected to the capacitor contact structure 210 through the metal-semiconductor contact structure 220. In this embodiment, the material of the conductive structure 240 includes metal tungsten.

The capacitor contact structure 210 is made of a doped semiconductor material, that is, n-type or p-type conductive doped polycrystalline silicon.

The material of the barrier structure 230 includes one or more selected from the group consisting of titanium nitride, aluminum nitride, boron nitride, hafnium nitride, tantalum nitride, titanium nitride, or zirconium nitride. In this embodiment, the material of the barrier structure is titanium nitride. The barrier structure 230 prevents the material of the conductive structure 240 from penetrating into the base 110, avoiding contamination of the base 110, thus ensuring the yield and usage lifetime of the semiconductor structure.

The metal-semiconductor contact structure 220 formed in this embodiment is formed by a two-dimensional semiconductor material and a material with the half metal property.

The energy band structure of a material with the half metal property includes two different energy subband structures, one of which has a metallic spin orientation and the other has a semiconductor property. The schottky barrier formed by the contact between the two-dimensional semiconductor material and the material with the half metal property in the metal-semiconductor contact structure 220 is smaller than the schottky barrier formed by the direct contact between the capacitor contact structure 210 and the subsequently formed conductive structure 240.

In the semiconductor structure of this embodiment, as shown in FIG. 15, the metal-semiconductor contact structure 220 is disposed between the capacitor contact structure 210 and the conductive structure 240. The metal-semiconductor contact structure 220 being the intermediate transition structure between the capacitor contact structure 210 and the conductive structure 240 reduces the schottky barrier generated by the contact between the capacitor contact structure 210 and the conductive structure 240. This further reduces the size of the semiconductor structure, increasing the potential for further miniaturization development of semiconductor structures.

According to an exemplary embodiment, most content of the semiconductor structure of this embodiment is the same as the above embodiment. This embodiment and the foregoing embodiment differ in that as shown in FIG. 13, the metal-semiconductor contact structure 220 includes a first contact layer 221 filled the first groove 215 and covering part of the sidewall of each of the adjacent two of the bit line structures 120 and a second contact layer 222 covering the first contact layer 221 and a part of the sidewall of each of the adjacent two of the bit line structures 120.

In this embodiment, the first contact layer 221 filled the first groove 215 increases the contact area between the first contact layer 221 and the first groove 215. With the second contact layer 222 covering the top surface of the first contact layer 221 and the part of the sidewall of each of the adjacent two of the bit line structures 120, the contact area between the second contact layer 222 and the conductive structure 240 is increased. This further improves the migration rate of the carriers from the capacitor contact structure 210 to the conductive structure 240 and thus increases the through-state current density between the capacitor contact structure 210 and the conductive structure 240.

According to an exemplary embodiment, most content of the semiconductor structure of this embodiment is the same as the above embodiment. This embodiment and the foregoing embodiment differ in that as shown in FIG. 19, the metal-semiconductor contact structure 220 includes a first contact layer 221 covering the top surface of the capacitor contact structure 210 and the second contact layer 222 filled the first groove 215 and covering part of the sidewall of each of the adjacent two of the bit line structures 120.

In this embodiment, the first contact layer 221 covers the top surface of the capacitor contact structure 210, that is, the first contact layer 221 is of a concave structure with the bottom down, increasing the contact area between the first contact layer 221 and the second contact layer 222, and reducing the contact resistance of the metal-semiconductor contact structure 220. In this case, the second contact layer 222 covers part of the sidewall of each of the adjacent two of the bit line structures 120, increasing the contact area between the second contact layer 222 and the conductive structure 240, reducing the contact resistance between the metal-semiconductor contact structure 220 and the conductive structure 240, thus further reducing the size of the semiconductor structure.

According to an exemplary embodiment, most content of the semiconductor structure in this embodiment is the same as the foregoing embodiment. This embodiment and the foregoing embodiment differ in that the material of the first contact layer 221 includes a single layer of semiconductor material, and the material of the second contact layer 222 includes a group VA half-metal element.

In this embodiment, the first contact material includes a single layer of semiconductor material of two-dimensional TMDs. For example, the first contact material can include at least one selected from the group consisting of $MoS_2$, $WS_2$, $ReS_2$, $TiSe_2$s, $NbSe_2$, or $ReSe_2$.

The second contact material can include at least one of the group VA half-metal elements: As, Sb, or Bi in the fourth-sixth period on the periodic table of chemical elements.

In this embodiment, the first contact layer 221 and the second contact layer 222 of the metal-semiconductor contact structure 220 form the half metal-semiconductor contact interface. The Fermi energy level of the group VA half-metal element of the second contact layer 222 is close to the minimum value of the semiconductor conduction band of the two-dimensional TMDs of the first contact layer 221, valence band of the two-dimensional TMD is saturated (the gap state is saturated), and the metal-induced gap state of the two-dimensional TMD induced by the group VA half-metal element is inhibited. The schottky barrier of the contact interface between the first contact layer 221 and the second contact layer 222 is near zero and therefore the impact of the schottky barrier on the contact resistance of the metal-semiconductor contact structure 220 is negligible. The first contact layer 221 and the second contact layer 222 form a good ohmic contact. The metal-semiconductor contact structure 220 in this embodiment reduces the contact resistance between the capacitor contact structure 210 and the conductive structure 240, allowing for larger carrier migration rate and higher through-state current density between the capacitor contact structure 210 and the conductive structure 240. This further reduces the size of the semiconductor structure and improves the potential of semiconductor structures for high performance and high miniaturization.

According to an exemplary embodiment, most content of the semiconductor structure of this embodiment is the same as the above embodiment. This embodiment and the foregoing embodiment differ in that as shown in FIG. 15, referring to FIG. 5, the base 110 includes a plurality of active area structures 111 and the shallow trench isolation structure 112. The top surfaces of the active area structures 111 are flush with the top surface of the shallow trench isolation structure 112. A part of the active area structures 111 and a part of the shallow trench isolation structure 112 are exposed between adjacent two of the bit line structures 120.

According to an exemplary embodiment, most content of the semiconductor structure of this embodiment is the same as the above embodiment. This embodiment and the foregoing embodiment differ in that as shown in FIG. 15, referring to FIG. 5, the semiconductor structure further includes a capacitor contact hole 140. The capacitor contact hole 140 is disposed on the base 110. The capacitor contact hole 140 is located between adjacent bit line structures 120. The capacitor contact hole 140 exposes part of the active area structures 111 and a part of the shallow trench isolation structure 112. The capacitor contact structure 210 fills the capacitor contact hole 140.

In this embodiment, the capacitor contact hole 140 being disposed on the base 110 increases the contact area between the capacitor contact structure 210 and the active area structure 111, which further decreases the contact resistance of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

INDUSTRIAL APPLICABILITY

In a method of manufacturing a semiconductor structure and a semiconductor structure in the present disclosure, as an intermediate transition structure between a capacitor contact structure and a conductive structure, a metal-semiconductor contact structure reduces the contact resistance between the capacitor contact structure and the conductive structure.

The invention claimed is:

1. A method of manufacturing a semiconductor structure, comprising:

providing an initial structure, wherein the initial structure comprises a base and a plurality of bit line structures disposed on the base, an initial trench is formed between adjacent two of the bit line structures, the base comprises a plurality of active area structures, and the initial trench exposes a part of the active area structures;

forming a capacitor contact structure, wherein the capacitor contact structure covers the part of the active area structures, and the capacitor contact structure comprises a first groove;

forming a metal-semiconductor contact structure, wherein the metal-semiconductor contact structure at least covers a top surface of the capacitor contact structure and fills the first groove;

forming a barrier structure, wherein the barrier structure covers the metal-semiconductor contact structure and a part of a sidewall of each of the adjacent two of the bit line structures; and forming a conductive structure, wherein the conductive structure covers the barrier structure and fills an unfilled part of the initial trench, and the conductive structure is connected to the capacitor contact structure through the metal-semiconductor contact structure.

2. The method of manufacturing a semiconductor structure according to claim 1, wherein the forming a metal-semiconductor contact structure comprises:

forming a first contact layer, wherein the first contact layer fills the first groove and a part of the initial trench; and forming a second contact layer, wherein the second contact layer covers a top surface of the first contact layer and a part of an exposed sidewall of the initial trench.

3. The method of manufacturing a semiconductor structure according to claim 1, wherein the forming a metal-semiconductor contact structure comprises:

forming a first contact layer, wherein the first contact layer covers the top surface of the capacitor contact structure; and forming a second contact layer, wherein the second contact layer fills the first groove and covers a part of an exposed sidewall of the initial trench.

4. The method of manufacturing a semiconductor structure according to claim 2, wherein the forming a first contact layer comprises:

depositing a first contact material to form the first contact layer, wherein the first contact material comprises monolayer semiconductors.

5. The method of manufacturing a semiconductor structure according to claim 4, wherein the forming a second contact layer comprises:

depositing a second contact material to form the second contact layer, wherein the second contact material comprises a group VA half-metal element.

6. The method of manufacturing a semiconductor structure according to claim 1, wherein the forming a capacitor contact structure comprises:

forming an initial capacitor contact structure, wherein the initial capacitor contact structure fills the initial trench;

etching back the initial capacitor contact structure, wherein a retained part of the initial capacitor contact structure forms the capacitor contact structure; and etching the capacitor contact structure, to form the first groove on the top surface of the capacitor contact structure.

7. The method of manufacturing a semiconductor structure according to claim 1, wherein the providing an initial structure comprises:

providing a substrate;

etching the substrate to form the plurality of active area structures arranged in an array;

forming a shallow trench isolation structure, wherein the shallow trench isolation structure is configured to isolate the active area structures;

forming bit line contact holes, wherein the bit line contact hole exposes a part of the active area structures and a part of the shallow trench isolation structure;

forming bit line contact parts, wherein the bit line contact part fills the bit line contact hole; and forming the bit line structures, wherein the bit line structure is disposed on top surfaces of the active area structures and a top surface of the shallow trench isolation structure, the bit line structure is connected to the bit line contact part, the bit line structures are parallel to each other, the initial trench is formed between the adjacent two of the bit line structures, and the initial trench exposes a part of top surfaces of the active area structures.

8. The method of manufacturing a semiconductor structure according to claim 7, after the forming the bit line structures, further comprising:

forming spacing structures in the initial trench, wherein an extension direction of the spacing structure is perpendicular to an extension direction of the bit line structure; and using the spacing structures and the bit line structures as a mask to remove a part of the active area structures and a part of the shallow trench isolation structure that are exposed by the initial trench, so as to form a capacitor contact hole.

9. The method of manufacturing a semiconductor structure according to claim 8, wherein the forming a capacitor contact structure comprises:

forming the capacitor contact structure, wherein the capacitor contact structure fills the capacitor contact hole and a part of the initial trench.

10. The method of manufacturing a semiconductor structure according to claim 3, wherein the forming a first contact layer comprises:

depositing a first contact material to form the first contact layer, wherein the first contact material comprises monolayer semiconductors.

11. The method of manufacturing a semiconductor structure according to claim 10, wherein the forming a second contact layer comprises:

depositing a second contact material to form the second contact layer, wherein the second contact material comprises a group VA half-metal element.

12. A semiconductor structure, comprising:

a base and a plurality of bit line structures disposed on the base;

a capacitor contact structure, formed between adjacent two of the bit line structures, wherein the capacitor contact structure comprises a first groove;

a metal-semiconductor contact structure, wherein the metal-semiconductor contact structure at least covers a top surface of the capacitor contact structure and fills the first groove;

a barrier structure, wherein the barrier structure covers the metal-semiconductor contact structure and a part of a sidewall of each of the adjacent two of the bit line structures; and a conductive structure, wherein the conductive structure covers the barrier structure, and the conductive structure is connected to the capacitor contact structure through the metal-semiconductor contact structure.

13. The semiconductor structure according to claim 12, wherein the metal-semiconductor contact structure comprises:

a first contact layer, wherein the first contact layer fills the first groove and covers a part of the sidewall of each of the adjacent two of the bit line structures; and a second contact layer, wherein the second contact layer covers the first contact layer and a part of the sidewall of each of the adjacent two of the bit line structures.

14. The semiconductor structure according to claim 12, wherein the metal-semiconductor contact structure comprises:

a first contact layer, wherein the first contact layer covers the top surface of the capacitor contact structure; and a second contact layer, wherein the second contact layer fills the first groove and covers a part of the sidewall of each of the adjacent two of the bit line structures.

15. The semiconductor structure according to claim 13, wherein a material of the first contact layer comprises monolayer semiconductors and a material of the second contact layer comprises a group VA half-metal element.

16. The semiconductor structure according to claim 12, wherein the base comprises a plurality of active area structures and a shallow trench isolation structure, top surfaces of the active area structures are flush with a top surface of the shallow trench isolation structure, and a part of the active area structures and a part of the shallow trench isolation structure are exposed between adjacent two of the bit line structures.

17. The semiconductor structure according to claim 16, further comprising:

a capacitor contact hole, wherein the capacitor contact hole is provided on the base, the capacitor contact hole is located between the adjacent two of the bit line structures, and the capacitor contact hole exposes the part of the active area structures and the part of the shallow trench isolation structure; and the capacitor contact structure fills the capacitor contact hole.

18. The semiconductor structure according to claim 14, wherein a material of the first contact layer comprises monolayer semiconductors and a material of the second contact layer comprises a group VA half-metal element.

* * * * *